US012339544B2

(12) United States Patent
Qu et al.

(10) Patent No.: US 12,339,544 B2
(45) Date of Patent: Jun. 24, 2025

(54) DISPLAY PANEL AND DISPLAY DEVICE

(71) Applicants:Beijing BOE Display Technology Co., Ltd., Beijing (CN); BOE Technology Group Co., Ltd., Beijing (CN)

(72) Inventors: Yingying Qu, Beijing (CN); Jianhua Huang, Beijing (CN); Qiujie Su, Beijing (CN); Yifu Chen, Beijing (CN); Zhihua Sun, Beijing (CN); Yu Zhang, Beijing (CN); Jiantao Liu, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 316 days.

(21) Appl. No.: 17/915,098

(22) PCT Filed: Jun. 17, 2021

(86) PCT No.: PCT/CN2021/100728
§ 371 (c)(1),
(2) Date: Sep. 27, 2022

(87) PCT Pub. No.: WO2022/022151
PCT Pub. Date: Feb. 3, 2022

(65) Prior Publication Data
US 2023/0152635 A1    May 18, 2023

(30) Foreign Application Priority Data

Jul. 27, 2020  (CN) .......................... 202010730558.0

(51) Int. Cl.
*G02F 1/1339*  (2006.01)
*G02F 1/1362*  (2006.01)
(Continued)

(52) U.S. Cl.
CPC .... *G02F 1/13396* (2021.01); *G02F 1/136286* (2013.01); *G02F 1/1368* (2013.01);
(Continued)

(58) Field of Classification Search
None
See application file for complete search history.

(56) References Cited

U.S. PATENT DOCUMENTS 9,134,572 B2   9/2015  Xu et al.
10,429,708 B2  10/2019 Liu et al.
(Continued)

FOREIGN PATENT DOCUMENTS

CN       1588189 A    3/2005
CN     102566145 A    7/2012
(Continued)

OTHER PUBLICATIONS

International Search Report issued in Application No. PCT/CN2021/100728 dated Sep. 24, 2021, with English transaltion, (6p).
(Continued)

*Primary Examiner* — Dung T Nguyen
(74) *Attorney, Agent, or Firm* — Arch & Lake LLP; Zhangyuan Ji

(57) ABSTRACT

A display panel, comprising open areas; a non-open area; an array substrate comprising a first substrate and gate lines, data lines, thin film transistors and raised portions located in the non-open area, wherein orthographic projections of the data lines on the first substrate have overlaps with orthographic projections of the gate lines on the first substrate, orthographic projections of the raised portions on the first substrate are located within the orthographic projections of the gate lines on the first substrate; and a color filter substrate comprising a second substrate and spacers located on a side of the second substrate; wherein orthographic projections of
(Continued)

the spacers on the first substrate have overlaps with the orthographic projections of the raised portions and overlapping parts of the data lines and the gate lines on the first substrate.

19 Claims, 10 Drawing Sheets

(51) Int. Cl.
  *G02F 1/1368* (2006.01)
  *G02F 1/1335* (2006.01)
  *G02F 1/1343* (2006.01)
  *H10D 86/40* (2025.01)
  *H10D 86/60* (2025.01)

(52) U.S. Cl.
  CPC .. *G02F 1/133512* (2013.01); *G02F 1/134309* (2013.01); *H10D 86/441* (2025.01); *H10D 86/60* (2025.01)

(56) References Cited

U.S. PATENT DOCUMENTS

| | | | |
|---|---|---|---|
| 10,564,503 B2 | 2/2020 | Cheng et al. | |
| 2012/0113347 A1* | 5/2012 | Shim | G02F 1/13394 349/156 |
| 2012/0138941 A1 | 6/2012 | Xu et al. | |
| 2015/0002772 A1 | 1/2015 | Du | |
| 2018/0074355 A1* | 3/2018 | Cheng | G02F 1/13394 |
| 2019/0041710 A1 | 2/2019 | Liu et al. | |
| 2020/0174300 A1 | 6/2020 | Cheng et al. | |

FOREIGN PATENT DOCUMENTS

| | | |
|---|---|---|
| CN | 103336391 A | 10/2013 |
| CN | 103487997 A | 1/2014 |
| CN | 203982044 U | 12/2014 |
| CN | 103487997 B | 11/2015 |
| CN | 105700251 A | 6/2016 |
| CN | 105892188 A | 8/2016 |
| CN | 205507295 U | 8/2016 |
| CN | 107255879 A | 10/2017 |
| CN | 107272271 A | 10/2017 |
| CN | 107402471 A | 11/2017 |
| CN | 109061969 A | 12/2018 |
| CN | 110174803 A | 8/2019 |
| CN | 111338144 A | 6/2020 |
| CN | 212569352 U | 2/2021 |
| EP | 3671335 A1 | 6/2020 |
| JP | 2003131238 A | 5/2003 |
| KR | 20150026586 A | 3/2015 |
| WO | 2015043255 A1 | 4/2015 |

OTHER PUBLICATIONS

International Search Report issued in Application No. PCT/CN2021/100728 dated Sep. 24, 2021 and Written Opinion, (10p).

* cited by examiner

DISPLAY PANEL AND DISPLAY DEVICE

CROSS-REFERENCE TO RELATED APPLICATION

The present application is a national phase application under 35 U.S.C. § 371 of International Patent Application No. PCT/CN2021/100728, filed on Jun. 17, 2021 which claims the benefit of and priority to Chinese patent application with application number 202010730558.0 and titled "DISPLAY PANEL AND DISPLAY DEVICE" filed on Jul. 27, 2020, disclosures of which are incorporated herein by reference in their entirety.

TECHNICAL FIELD

The present disclosure relates to the field of display technology, and in particular, to a display panel and a display device.

BACKGROUND

With the continuous development of liquid crystal panels, high-resolution products are constantly being developed. However, with the increase of pixels, it is easy to lead to a series of problems. For example, when some pressure tests or drop tests are performed on LCD panels, uneven brightness such as bright spots and snowflakes are prone to occur, thus affecting product reliability and product quality.

It should be noted that the information disclosed in the above background section is only for enhancing understanding of the background of the present disclosure, and therefore may include information that does not form the prior art known to a person of ordinary skill in the art.

SUMMARY

The purpose of the present disclosure is to provide a display panel and a display device, which may improve product reliability and product quality.

A first aspect of the present disclosure provides a display panel, including open areas and a non-open area surrounding the open areas, wherein the display panel includes:

an array substrate including a first substrate and gate lines, data lines, thin film transistors and raised portions located in the non-open area and formed on the first substrate; wherein the gate lines and the data lines are insulated from each other, the gate lines extend in a first direction, and the data lines extend in a second direction; orthographic projections of the data lines on the first substrate have overlaps with orthographic projections of the gate lines on the first substrate; orthographic projections of the raised portions on the first substrate are located within the orthographic projections of the gate lines on the first substrate, and have no overlap with the orthographic projections of the data line and orthographic projections of the thin film transistors on the first substrate; and a color filter substrate including a second substrate and spacers located on a side of the second substrate facing the array substrate; wherein orthographic projections of the spacers on the first substrate have overlaps with the orthographic projections of the raised portions on the first substrate, and have overlaps with overlapping parts of the data lines and the gate lines on the first substrate.

In an exemplary embodiment of the present disclosure, the raised portions are disposed in a same layer as the data lines, and are insulated from the data lines, the gate lines, and the thin film transistors.

In an exemplary embodiment of the present disclosure, the orthographic projections of the raised portions on the first substrate are strips, and the raised portions extend in the second direction; and outer edges of the raised portions in the second direction are located outside outer edges of the spacers in the second direction.

In an exemplary embodiment of the present disclosure, the spacers are provided in multiples; a plurality of the spacers include auxiliary spacers, and gaps are provided between the auxiliary spacers and the array substrate; wherein the array substrate includes:

first regions located in the non-open area; wherein the first regions include the raised portions corresponding to the auxiliary spacers, and first retaining walls and second retaining walls located on two sides of the raised portions in the second direction; and second regions located in the non-open area; wherein the second regions include the raised portions corresponding to the auxiliary spacers, third retaining walls and fourth retaining walls located on two sides of the raised portions in the second direction, fifth retaining walls located between the raised portions and the third retaining walls, and sixth retaining walls located between the raised portions and the fourth retaining walls; and thicknesses of the fifth retaining walls are smaller than thicknesses of the third retaining walls, and thicknesses of the sixth retaining walls are smaller than thicknesses of the fourth retaining walls.

In an exemplary embodiment of the present disclosure, the array substrate further includes common signal lines located in the non-open area, and the common signal lines extend in the first direction and located on a side of the gate lines;

the first retaining wall is located on a side of the gate line distal to the common signal line, and the first retaining wall includes a first pad layer and a second pad layer; the first pad layer is arranged on a same layer as the gate line; and the second pad layer is arranged on a same layer as the data line; and the second retaining wall is located on a side of the gate line close to the common signal line, and the second retaining wall includes a third pad layer and a fourth pad layer; the third pad layer is arranged on a same layer as the common signal line; and the fourth pad layer is arranged on a same layer as the data line.

In an exemplary embodiment of the present disclosure, in the first region, a distance between an orthographic projection of the first retaining wall on the first substrate and an orthographic projection of the auxiliary spacer on the first substrate is a first interval; and a ratio of the first interval to a size of the data line in the first direction is 2 to 3; and a distance between an orthographic projection of the second retaining wall on the first substrate and the orthographic projection of the auxiliary spacer on the first substrate is a second interval; and a ratio of the second interval to the size of the data line in the first direction is 2 to 3.

In an exemplary embodiment of the present disclosure, the first interval is equal to the second interval.

In an exemplary embodiment of the present disclosure, a ratio of a size of the first retaining wall in the first direction to a size of the data line in the first direction is 0.8 to 1; and a ratio of a size of the second retaining wall in the first direction to the size of the data line in the first direction is 0.8 to 1.

In an exemplary embodiment of the present disclosure, the third retaining wall is located on the side of the gate line distal to the common signal line, and the third retaining wall includes a fifth pad layer and a sixth pad layer; the fifth pad layer is arranged on the same layer as the gate line; and the sixth pad layer is arranged on the same layer as the data line;

the fourth retaining wall is located on a side of the common signal line distal to the gate line, and the fourth retaining wall includes a seventh pad layer and an eighth pad layer; the seventh pad layer is arranged on the same layer as the gate line; and the eighth pad layer is arranged on the same layer as the data line;

the fifth retaining wall is located on the side of the gate line distal to the common signal line, and the fifth retaining wall includes a ninth pad layer disposed in the same layer as the data line; and the sixth retaining wall is located on the side of the gate line close to the common signal line, and the sixth retaining wall includes a tenth pad layer disposed in the same layer as the common signal line.

In an exemplary embodiment of the present disclosure, in the second region, a distance between an orthographic projection of the third retaining wall on the first substrate and an orthographic projection of the auxiliary spacer on the first substrate is a third interval;

a distance between an orthographic projection of the fourth retaining wall on the first substrate and the orthographic projection of the auxiliary spacer on the first substrate is a fourth interval;

a distance between an orthographic projection of the fifth retaining wall on the first substrate and the orthographic projection of the auxiliary spacer on the first substrate is a fifth interval; and a distance between an orthographic projection of the sixth retaining wall on the first substrate and the orthographic projection of the auxiliary spacer on the first substrate is a sixth interval;

wherein the third interval is equal to the fourth interval; and the fifth interval is larger than the sixth interval.

In an exemplary embodiment of the present disclosure, ratios of the third interval and the fourth interval to a size of the data line in the first direction is 5 to 6;

ratios of the fifth interval and the sixth interval to the size of the data line in the first direction is 2 to 3; and a ratio of a distance between the third retaining wall and the fifth retaining wall to the size of the data line in the first direction is 1 to 2.

In an exemplary embodiment of the present disclosure, a size of the fourth retaining wall in the first direction is larger than a size of the third retaining wall in the first direction, and is larger than a size of the fifth retaining wall in the first direction.

In an exemplary embodiment of the present disclosure, ratios of the sizes of the third retaining wall and the fifth retaining wall in the first direction to a size of the data line in the first direction is 0.8 to 1; and a ratio of the size of the fourth retaining wall in the first direction to the size of the data line in the first direction is 1.4 to 2.

In an exemplary embodiment of the present disclosure, the thin film transistors include source electrodes and drain electrodes, the source electrodes and the drain electrodes are arranged in the same layer as the data lines, and the source electrodes are electrically connected to the data lines; and the array substrate further includes pixel electrodes and common electrodes disposed opposite to each other in a thickness direction of the array substrate, and the pixel electrodes and the common electrodes are formed on the first substrate and located in the open areas and the non-open area;

wherein parts of the pixel electrodes located in the non-open area are electrically connected to the drain electrodes; the common signal lines are electrically connected to parts of the common electrodes located in the non-open area; and the thickness direction is orthogonal to the first direction and the second direction.

In an exemplary embodiment of the present disclosure, the gate lines are located on a side of the data lines close to the first substrate;

the pixel electrodes are located on the side of the data line close to the first substrate;

the common electrodes are located on a side of the data lines distal to the first substrate; and the common signal lines are located on the side of the data line distal to the first substrate, and lap the common electrodes.

In an exemplary embodiment of the present disclosure, one of the pixel electrode and the common electrode is a plate electrode, and another one of the pixel electrode and the common electrode is a slit electrode.

In an exemplary embodiment of the present disclosure, the spacers further include main spacers, and the main spacers are in contact with the array substrate; and orthographic projections of both the main spacers and the auxiliary spacers on the first substrate are strips, and a length direction of the main spacers and the auxiliary spacers is the first direction, and a width direction of the main spacers and the auxiliary spacers is the second direction;

wherein a size of the main spacers in the first direction is equal to a size of the auxiliary spacers in the first direction; and a size of the main spacers in the second direction is larger than a size of the auxiliary spacers in the second direction.

In an exemplary embodiment of the present disclosure, ratios of the sizes of the main spacers and the auxiliary spacers in the first direction to a size of the data line in the first direction is 2 to 3;

a ratio of the size of the main spacers in the second direction to the size of the data line in the first direction is 1.4 to 2; and a ratio of the size of the auxiliary spacers in the second direction to the size of the data line in the first direction is 1 to 1.5.

In an exemplary embodiment of the present disclosure, the color filter substrate further includes a black matrix corresponding to the non-open area;

a ratio of a distance between an edge of the main spacer and an edge of the black matrix in the second direction to the size of the data line in the first direction is 6 to 7;

a ratio of a distance between an edge of the auxiliary spacer and the edge of the black matrix in the second direction to the size of the data line in the first direction is 6 to 7; and a ratio of a distance between an edge of the fourth retaining wall and the edge of the black matrix in the second direction to the size of the data line in the first direction is 1 to 2.

In an exemplary embodiment of the present disclosure, both the first regions and the second regions are provided in multiples.

A second aspect of the present disclosure provides a display device, characterized in including the display panel described in any one of the above.

It is to be understood that the foregoing general description and the following detailed description are exemplary and explanatory only and are not limiting of the present disclosure.

BRIEF DESCRIPTION OF THE DRAWINGS

The accompanying drawings, which are incorporated in and constitute a part of this specification, illustrate embodiments consistent with the disclosure and together with the description serve to explain the principles of the disclosure. Apparently, the drawings in the following description are only some embodiments of the present disclosure, and for those of ordinary skill in the art, other drawings may be obtained from these drawings without creative effort as well.

REFERENCE NUMBERS

Figure 1:
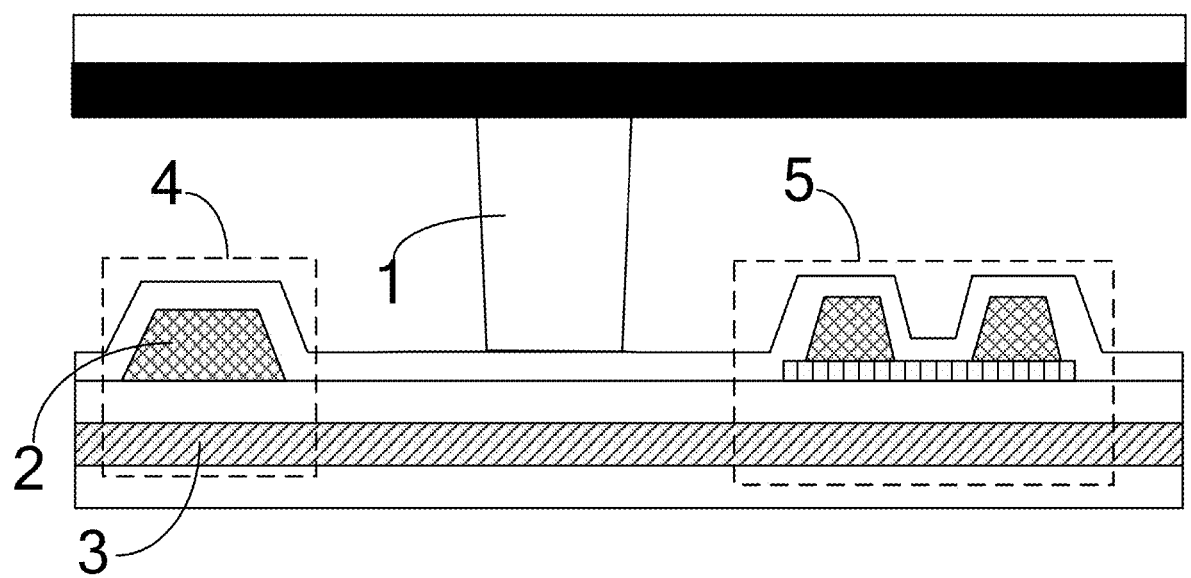
FIG. 1 shows a schematic structural diagram of a display panel in the related art.

1, Spacer; 2, data line; 3, gate line; 4, overlapping part; 5, thin film transistor; 10, display panel; 10a, open area; 10b, non-open area; 11, array substrate; 11a, first retaining wall; 11aa, first pad layer; 11ab, second pad layer; 11b, second retaining wall; 11ba, third pad layer; 11bb, fourth pad layer; 11c, third retaining wall; 11ca, fifth pad layer; 11cb, sixth pad layer; 11d, fourth retaining wall; 11da, seventh pad layer; 11db, eighth pad layer; 11e, fifth retaining wall; 11ca, ninth pad layer; 11f, sixth retaining wall; 11fa, tenth pad layer; 110, first substrate; 111, gate line; 112, data line; 113, thin film transistor; 113a, gate; 113b, active layer; 113c, source electrode, 113d, drain electrode; 114, raised portion; 115, common electrode; 115a, slit; 116, pixel electrode; 117, first insulating layer; 118, second insulating layer; 119, common signal line; 12, color filter substrate; 120, second substrate; 121, main spacer; 122, auxiliary spacer; 123, black matrix; 13, liquid crystal molecules.

DETAILED DESCRIPTION

The technical solutions of the present disclosure will be further specifically described below through the embodiments and in conjunction with the accompanying drawings. In the specification, the same or similar reference numerals refer to the same or similar parts. The following description of the embodiments of the present disclosure with reference to the accompanying drawings is intended to explain the general inventive concept of the present disclosure, and should not be construed as a limitation of the present disclosure.

Furthermore, in the following detailed description, for convenience of explanation, numerous specific details are set forth in order to provide a thorough understanding of the embodiments of the present disclosure. Apparently, however, one or more embodiments may be practiced without these specific details.

It should be noted that "on", "formed on" and "arranged on one side" described herein may mean that one layer is directly formed or disposed on another layer, or may mean one layer is formed or disposed indirectly on another layer, i.e., there are other layers between the two layers.

The terms "said", "the" are used to indicate the presence of one or more elements/components/etc.; the term "include" is used to indicate an open-ended inclusive meaning and means, in addition to the listed elements/components/etc., there may be additional elements/components/etc.

It should be noted that, although the terms "first", "second", etc. may be used herein to describe various assemblies, components, elements, regions, layers and/or parts, these assemblies, components, elements, regions, layers and/or parts shall not be limited by these terms. Rather, these terms are used to distinguish one assembly, component, element, region, layer and/or part from another one.

In the drawings, the sizes of respective constituent elements, and the thicknesses or regions of layers, are sometimes exaggerated for clarity. Therefore, one form of the present disclosure is not necessarily limited to the size, and shapes and sizes of the respective components in the drawings do not reflect true scale. In addition, the drawings schematically show ideal examples, and one form of the present disclosure is not limited to the shapes, numerical values, and the like shown in the drawings.

In the present disclosure, for the sake of convenience, words indicating orientation or positional relationship, such as "middle area", "areas on two sides", "inner", "outer", are used to describe the positional relationship of the constituent elements with reference to the drawings, only for the purpose of facilitating illustration of the specification and simplifying illustration, rather than indicating or implying that the referred device or element must have a particular orientation, be constructed and operate in a particular orientation, and therefore should not be construed as limiting the present disclosure. The positional relationship of the constituent elements may be appropriately changed according to the direction in which each constituent element is described. Therefore, it is not limited to the words and phrases described in the specification, and may be appropriately replaced according to specific situations.

In this disclosure, unless otherwise stated, the term "same layer arrangement" is used to mean that two layers, assemblies, components, elements or parts may be formed by the same patterning process, and that the two layers, assemblies, components, elements or parts are generally formed of the same material.

In the present disclosure, unless otherwise specified, the expression "patterning process" generally includes steps of photoresist coating, exposure, development, etching, and photoresist stripping, etc. The expression "one-shot patterning process" means a process of forming patterned layers, features, members, etc. using one mask.

For high-resolution display products, such as 55-inch 8K ultra-high-definition resolution (7680×4320) LCD TV, due to the limited pixel space, as shown in FIG. 1, distances between a spacer 1 and an overlapping part 4 of a data line 2 and a gate line 3 and between the spacer 1 and a thin film transistor 5 are very small. The spacer 1 is usually arranged in alignment with the gate line 3, that is, an orthographic projection of the spacer 1 on the substrate is located within an orthographic projection of the gate line 3 on the substrate. In this way, when the display panel is hit by a strong force, the spacer 1 will be displaced greatly, that is, the spacer 1 may move from its alignment position to the position of the overlapping part 4 of the data line 2 and the gate line 3, or move to the thin film transistor 5.

As shown in FIG. 1, a thickness of an area of the substrate where the overlapping part 4 of the data line 2 and the gate line 3 is located, and a thickness of an area of the substrate where the thin film transistor 5 is located, are larger than a thickness of an area of the substrate aligned with the spacer 1; and the area of the substrate where the overlapping part 4 of the data line 2 and the gate line 3 is located and the area of the substrate where the thin film transistor 5 is located, have large level differences with the area of the substrate aligned with the spacer 1; therefore, when the spacer 1 move from its alignment position to the position of the overlapping part 4 of the data line 2 and the gate line 3, or move to the thin film transistor 5, it will cause a large change in thickness of a liquid crystal cell, which will easily lead to a pretty conspicuous change in brightness of a display product. If the spacer 1 cannot be restored quickly, a conspicuous mura (uneven brightness) phenomenon will occur, for example, mura phenomenon such as tapping snowflakes; and in addition, a black matrix will be displaced greatly as well to block the brightness and form black mura.

Figure 2:
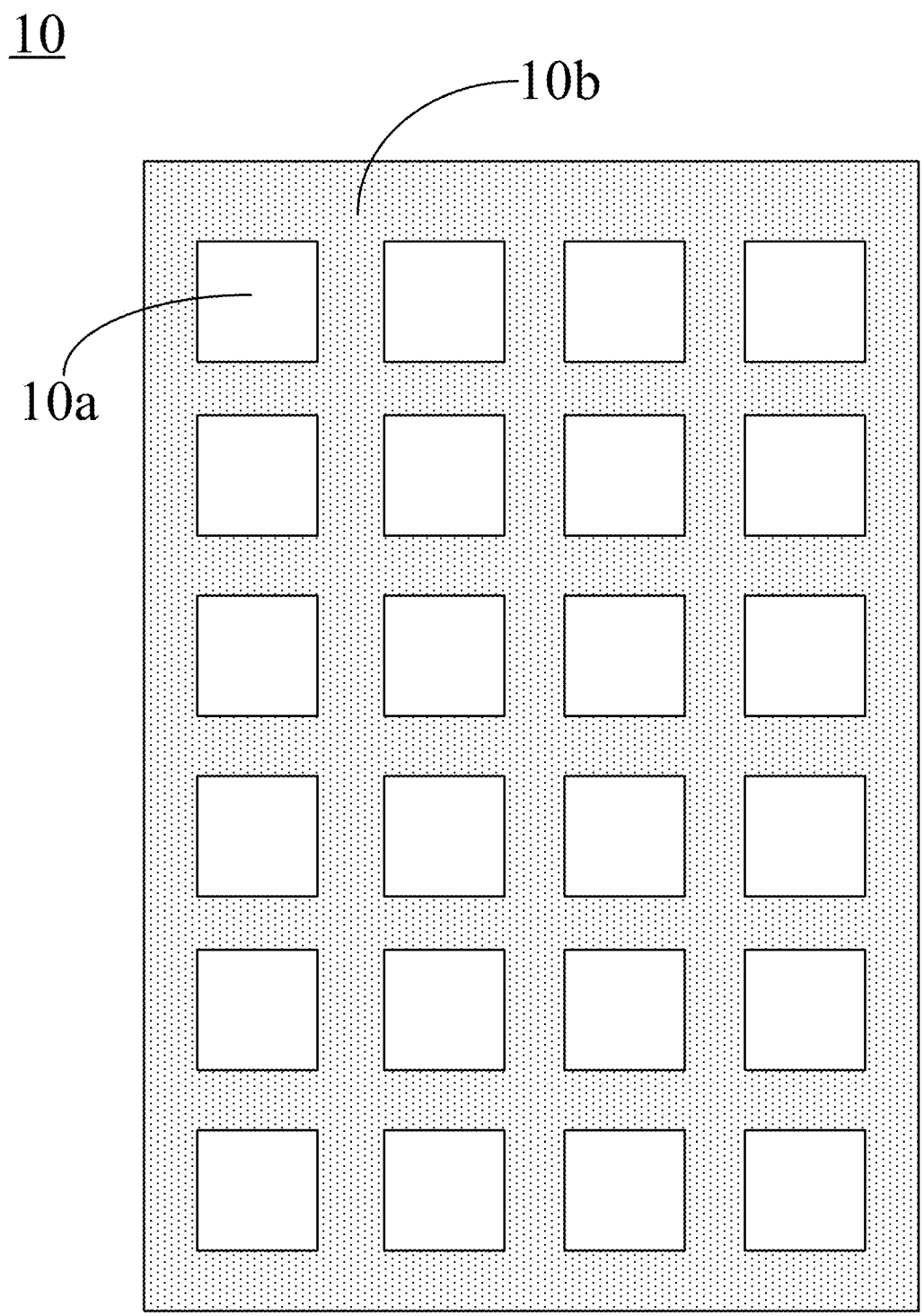
FIG. 2 shows a schematic plan view of a display panel according to an embodiment of the present disclosure.

Based on the problem, the embodiments of the present disclosure provides a display panel, which may be a liquid crystal display panel, wherein, as shown in FIG. 2, a display panel 10 may include open areas 10a, and a non-open area 10b surrounding the open areas 10a; the non-open area 10b is an area corresponding to a black matrix of a color filter substrate, and the black matrix is used to block non-transparent structures (such as data lines, gate lines, etc.) in the display panel; the open areas 10a are not blocked by the black matrix; and the open areas 10a allow light emitted by a backlight module (not shown in the figures) to pass through, and the light emitted by the backlight module (not shown in the figures) is blocked in the non-open area 10b.

Figure 3:
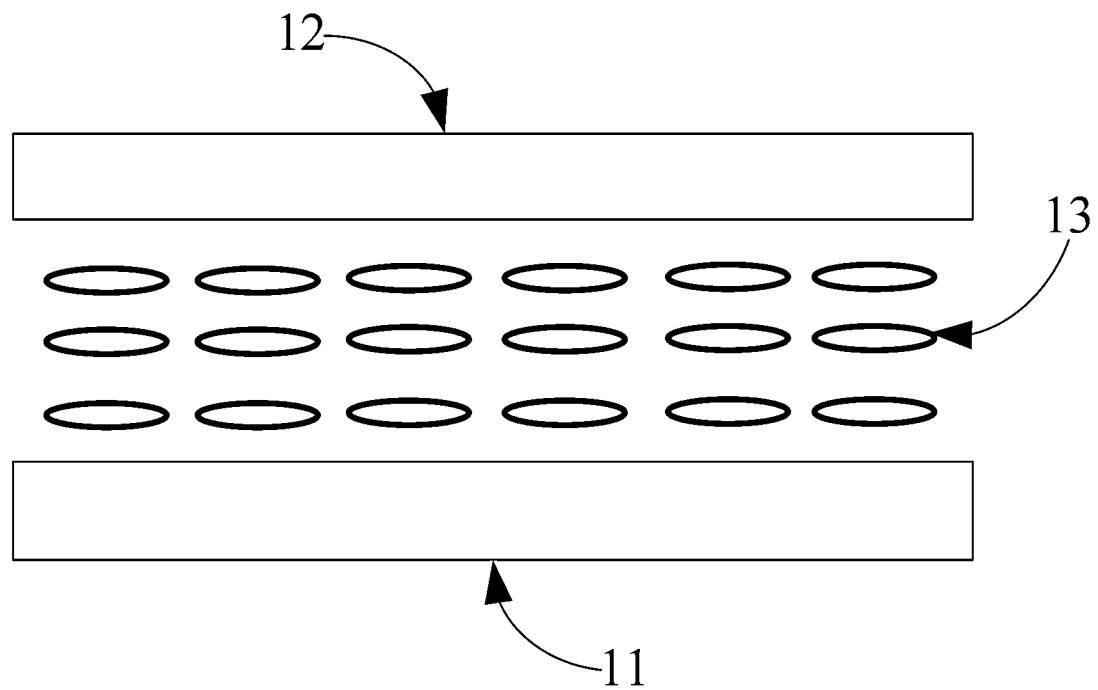
FIG. 3 shows a schematic cross-sectional view of a display panel in one direction according to an embodiment of the present disclosure.

In detail, as shown in FIG. 3, the display panel 10 may include an array substrate 11 and a color filter substrate 12. The array substrate 11 and the color filter substrate 12 may be arranged in a cell-to-cell arrangement. It should be understood that the display panel 10 may include liquid crystal molecules 13 as well. The liquid crystal molecules 13 are located between the array substrate 11 and the color filter substrate 12.

As shown in FIGS. 4 to 10, the array substrate 11 may include a first substrate 110, gate lines 111, data lines 112, thin film transistors 113, and raised portions 114. The gate lines 111, the data lines 112, the thin film transistors 113, and the raised portions 114 may be formed on the first substrate 110 and located in the non-open area 10b. The gate lines 111 need to be insulated from the data lines 112; the gate lines 111 extend in a first direction X, the data lines 112 extend in a second direction Y, and an orthographic projection of the data line 112 on the first substrate 110 and an orthographic projection of the gate line 111 on the first substrate 110 have an overlap, that is, the second direction Y intersects the first direction X, and optionally, the second direction Y is orthogonal to the first direction X; and an orthographic projection of the raised portion 114 on the first substrate 110 is located within the orthographic projection of the gate line 111 on the first substrate 110, and does not overlap with the orthographic projection of the data line 112 on the first substrate 110 and an orthographic projection of the thin film transistor 113 on the first substrate 110.

As shown in FIGS. 4 to 10, the color filter substrate 12 may include a second substrate 120 and spacers 121 and 122. The spacers 121 and 122 are located on a side of the second substrate 120 facing the array substrate 11 for maintaining a thickness of the display panel 10; wherein orthographic projections of the spacers 121 and 122 on the first substrate 110 overlap with the orthographic projections of the raised portions 114 on the first substrate 110, and overlap with overlapping parts of the data lines 112 and the gate lines 111 on the first substrate 110.

In the embodiments of the present disclosure, by arranging the raised portions 114 in areas corresponding to the spacers 121 and 122 in the array substrate 11, the areas corresponding to the spacers 121 and 122 in the array substrate 11 themselves have relatively high thicknesses, thus reducing level differences between the areas corresponding to the spacers 121 and 122 and surrounding area in the array substrate 11 (for example, the areas where the overlapping parts of the data lines 112 and the gate lines 111 are located, the areas where the thin film transistors 113 are located, etc.); then, even if the spacers 121 and 122 move to the areas where the thin film transistors 113 are located or the areas where the overlapping parts of the data lines 112 and the gate lines 111 are located after the display panel 10 is hit hard, it will not cause the display panel 10 to change compression amount too much, or even not change the compression amount, which may release a situation that the display product is prone to Mrura phenomenon, and improve product reliability and product quality.

The orthographic projections of the spacers 121 and 122 on the first substrate 110 in the embodiments of the present disclosure correspond to the overlapping parts of the data lines 112 and the gate lines 111 as well, therefore, when the spacers 121 and 122 moves to the areas where the overlapping parts of the data lines 112 and the gate lines 111 are located after the display panel 10 is hit hard, it will not cause the display panel 10 to change compression amount, which further releases a situation that the display product is prone to mura phenomenon.

In addition, the level differences between the areas corresponding to the spacers 121 and 122 and areas of two sides thereof in the first direction X in the array substrate 11 are small, therefore, when the spacers 121 and 122 slide in the first direction X, resistances are very small, then, when the external force is removed, the spacers may be quickly restored, so as to solve the mura phenomenon.

It should be noted that the orthographic projections of the spacers 121 and 122 on the first substrate 110 partially overlap with the overlapping parts of the data line 112 and the gate line 111 on the first substrate 110, but not limited thereto. The orthographic projections of the spacers 121 and 122 on the first substrate 110 may entirely overlap with the overlapping parts of the data line 112 and the gate line 111 on the first substrate 110.

Figure 5:
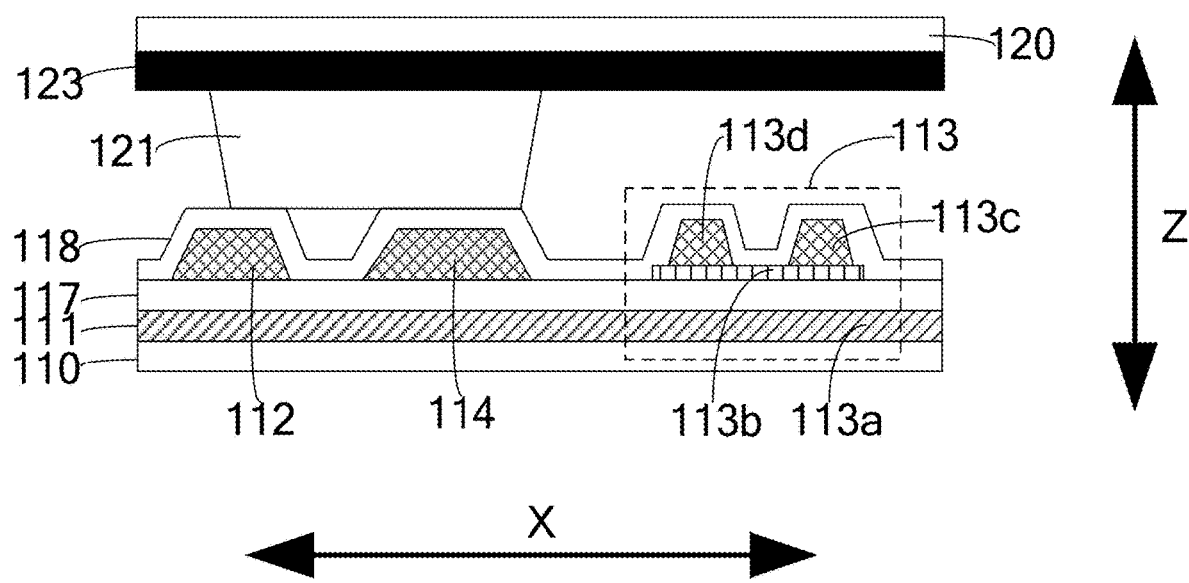
FIG. 5 shows a schematic cross-sectional view of the main region along a line A-A shown in FIG. 4.
Figure 8:
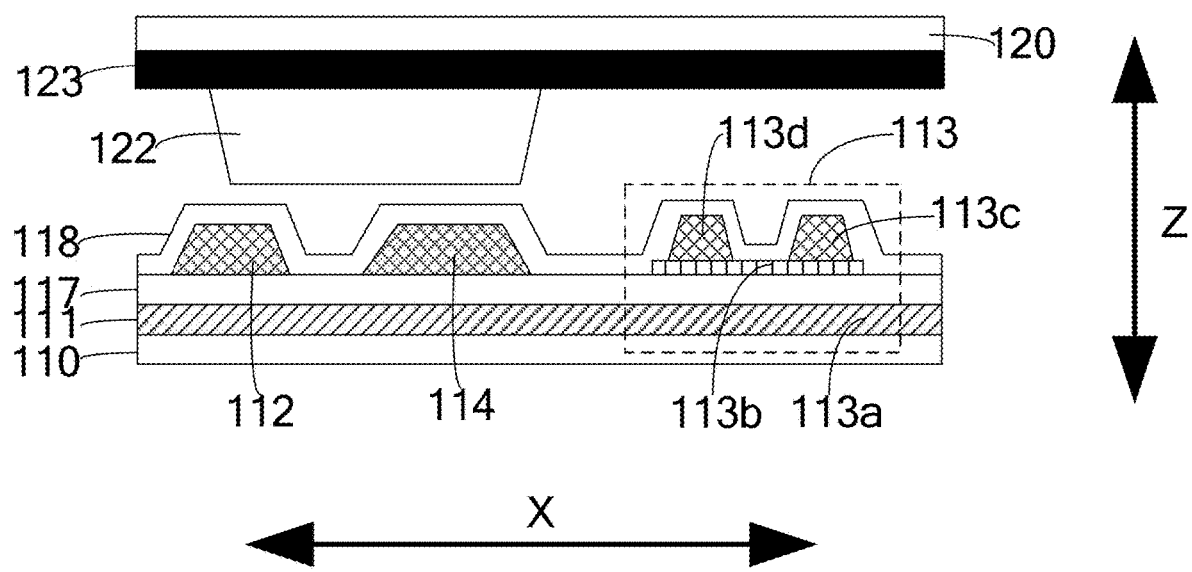
FIG. 8 shows a schematic cross-sectional view of the first region along a line B-B shown in FIG. 6, or shows a schematic cross-sectional view of the second region along a line D-D shown in FIG. 7.

It should be understood that the spacers in the display panel 10 may be provided in multiples, a plurality of the spacers may include main spacers 121 and auxiliary spacers 122, and both the main spacers 121 and the auxiliary spacers 122 are provided in multiples, and are evenly distributed in the display panel 10. When the display panel 10 is not subjected to external pressure, both ends of the main spacer 121 may be in contact with the array substrate 11 and the color filter substrate 12 respectively, as shown in FIG. 5, and mainly play a supporting role. There is a gap between the auxiliary spacer 122 and the array substrate 11 when the display panel 10 is not subjected to external pressure, as shown in FIG. 8. That is to say, there is a level difference (thickness difference) between the main spacer 121 and the auxiliary spacer 122, and the thickness of the display panel 10 may be fine-tuned by adjusting the level difference between the main spacer 121 and the auxiliary spacer 122. For example, a thickness of the main spacer 121 is larger than a thickness of the auxiliary spacer 122. When the display panel 10 is subjected to external pressure, the main spacer 121 first bears all the pressure and is compressed. When the main spacer 121 is compressed until the level difference between the main spacer 121 and the auxiliary spacer 122 is reduced to 0, the main spacer 121 and the auxiliary spacer 122 jointly bear the external pressure.

In addition, it should be understood as well that, in the embodiments of the present disclosure, the areas corresponding to both the main spacers 121 and the auxiliary spacers 122 in the array substrate 11 may be provided with the raised portions 114.

The display panel 10 of the embodiments of the present disclosure will be described in detail below with reference to the accompanying drawings.

The first substrate 110 may be located in the open areas 10a and the non-open area 10b; and the first substrate 110 may be a single-layer structure or a multi-layer structure. For example, as shown in FIGS. 5, 8 to 9, the first substrate 110 may be the single-layer structure, and material of the first substrate 110 may be glass, that is, the first substrate 110 may be a glass substrate, but not limited thereto, and other materials are applicable as well, as the case may be.

Figure 9:
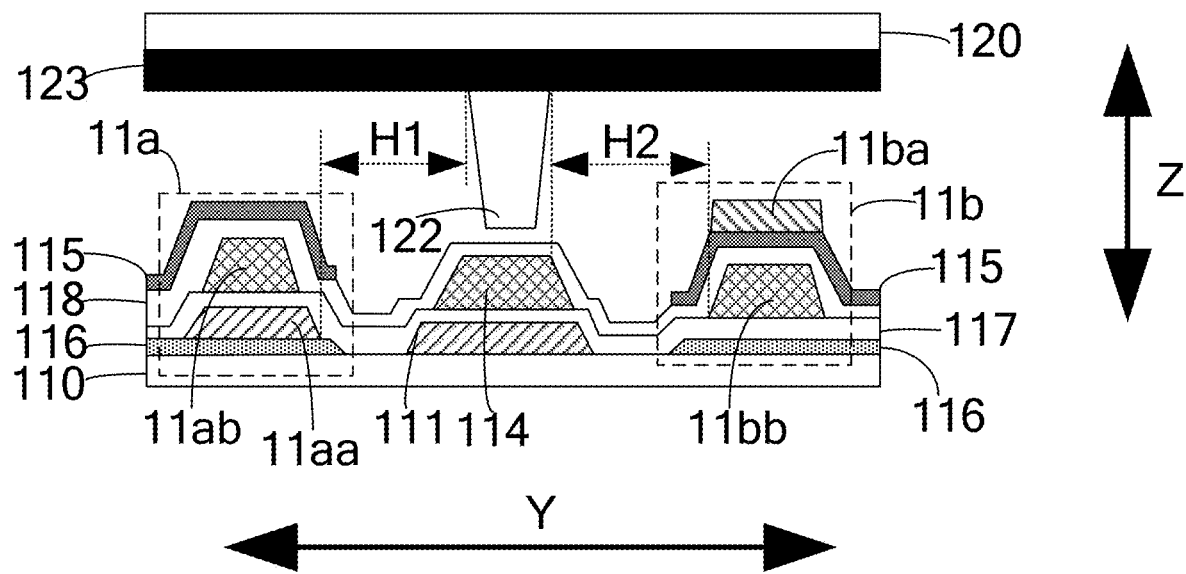
FIG. 9 shows a schematic cross-sectional view of the first region along a line C-C shown in FIG. 6.

As shown in FIGS. 5, 8 to 9, the gate lines 111 may be located on a side of the data lines 112 close to the first substrate 110, and the gate lines 111 may be directly formed on the first substrate 110, but not limited thereto, and the gate lines 111 may be located on a side of the data lines 112 distal to the first substrate 110 as well.

It should be understood that the orthographic projections of the gate lines 111 and the data lines 112 on the first substrate 110 have overlaps, therefore, in order to realize insulation between the gate lines 111 and the data lines 112, after the gate lines 111 are formed and before the data lines 112 are formed, a first insulating layer 117 may be formed on the first substrate 110 as well, and the first insulating layer 117 may cover the gate lines 111, as shown in FIGS. 5, 8 to 9.

A size of the data line 112 in the first direction X may be 5 μm to 7 μm, for example, 5 μm, 5.5 μm, 6 μm, 6.5 μm, 7 μm, etc., but not limited thereto, and the size of the data line 112 in the first direction X may be in other value ranges as well, depending on the specific situation.

For example, the gate lines 111 and the data lines 112 may include metal materials or alloy materials, such as metal single-layer or multi-layer structure formed of copper, molybdenum, aluminum, titanium, etc., to ensure good electrical conductivity thereof, and the first insulation layer 117 may be made of inorganic materials, for example, inorganic materials such as silicon oxide and silicon nitride.

As shown in FIGS. 4 to 8, the thin film transistor 113 may include a gate electrode 113a, an active layer 113b, a source electrode 113c and a drain electrode 113d. The thin film transistor 113 may be a top gate type or a bottom gate type. In the embodiments of the present disclosure, the thin film transistor 113 is illustrated mainly by an example of bottom gate type. As shown in the figures, when the thin film transistor 113 is a bottom gate type, the gate 113a is formed on the first substrate 110, and the gate 113a and the gate line 111 may be arranged in a same layer to reduce manufacturing cost. The active layer 113b is formed on a side of the gate electrode 113a distal to the first substrate 110. It should be understood that the aforementioned first insulating layer 117 is further located between the active layer 113b and the gate electrode 113a, so as to realize insulation between the active layer 113b and the gate electrode 113a. The source electrode 113c and the drain electrode 113d are respectively connected to two ends of the active layer 113b, and the source electrode 113c and the drain electrode 113d may be arranged in a same layer as the data line 112 to reduce manufacturing cost.

It should be noted that thin film transistors 113 may be provided in multiples, the gates 113a of a part of the thin film transistors 113 may be parts of the gate lines 111; and the gates 113a of another part of the thin film transistors 113 are disconnected from the gate lines 111. In addition, the source electrodes 113c of a part of the thin film transistors 113 may further be directly electrically connected to the data lines 112.

As shown in FIGS. 5, 8 to 9, the raised portions 114 and the data lines 112 may be disposed in the same layer to reduce cost. The raised portions 114 only serve a purpose of raising and thickening the areas corresponding to the spacers in the array substrate 11, and the raised portions 114 are insulated from the data lines 112, the gate lines 111 and the thin film transistors 113 from each other, without electrical connection relationship.

Figure 4:
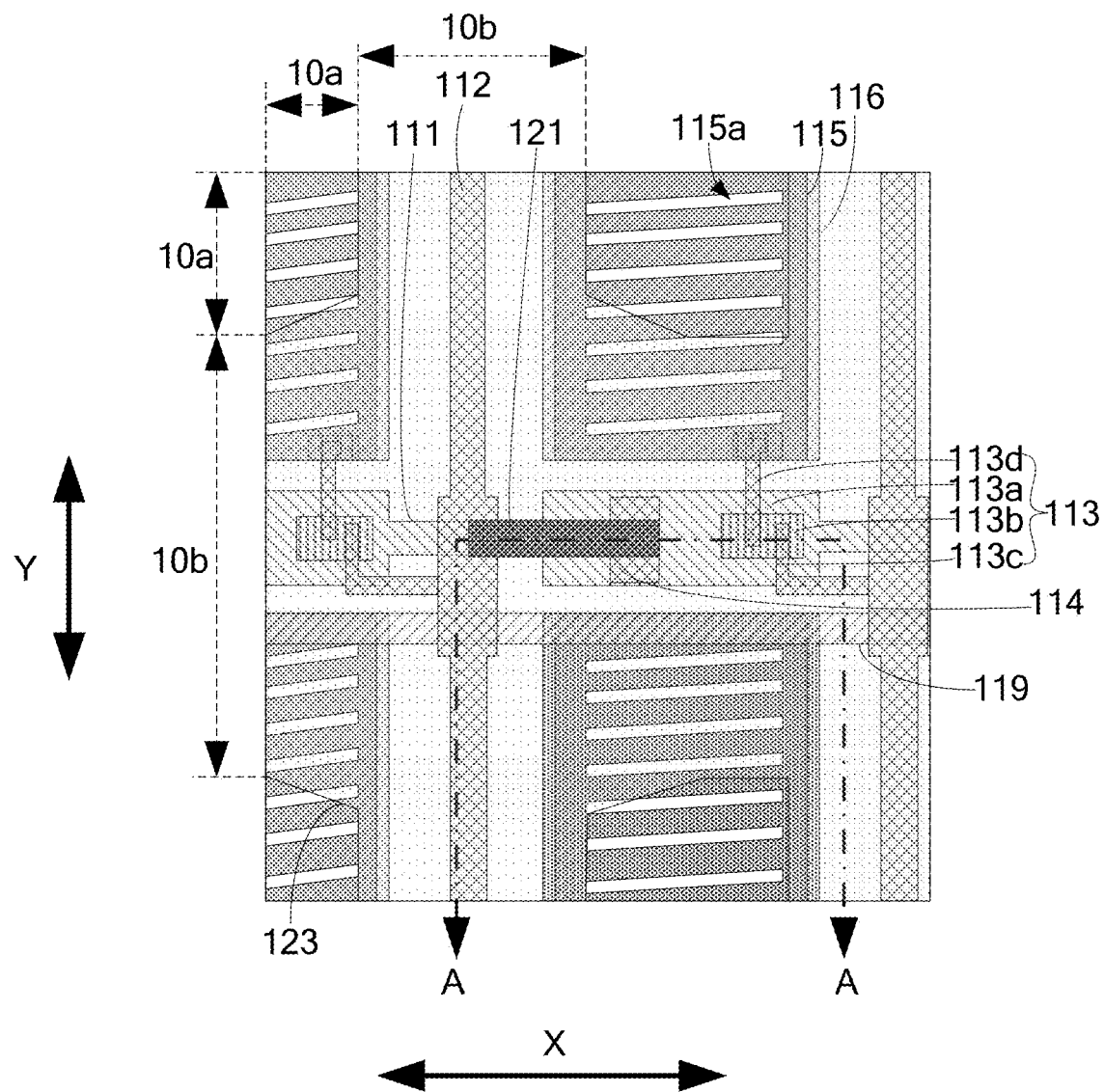
FIG. 4 shows a schematic position-relationship diagram of structures of respective layers in a main region of the display panel according to an embodiment of the present disclosure.
Figure 6:
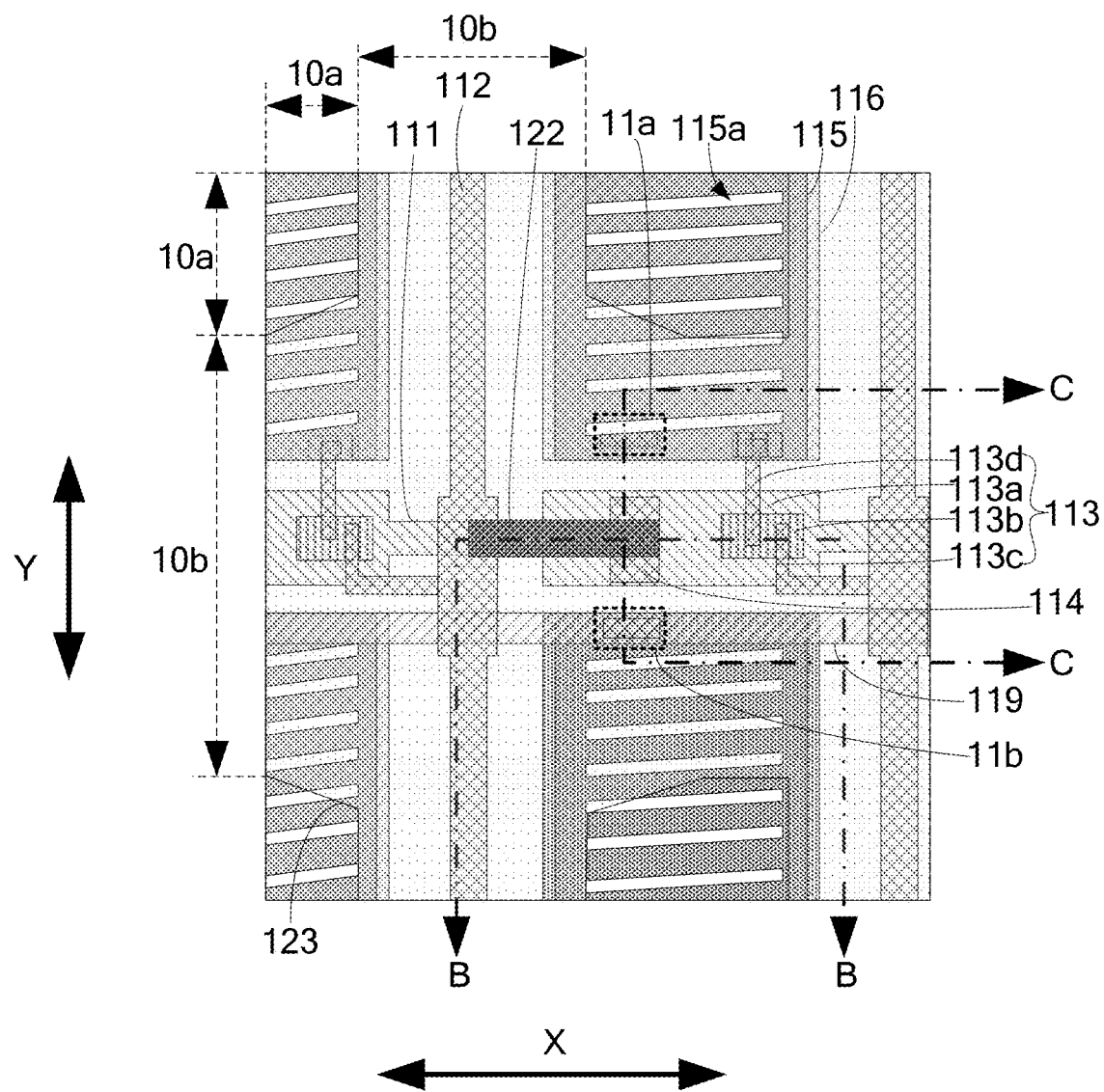
FIG. 6 shows a schematic position-relationship diagram of structures of respective layers in a first region of the display panel according to an embodiment of the present disclosure.
Figure 7:
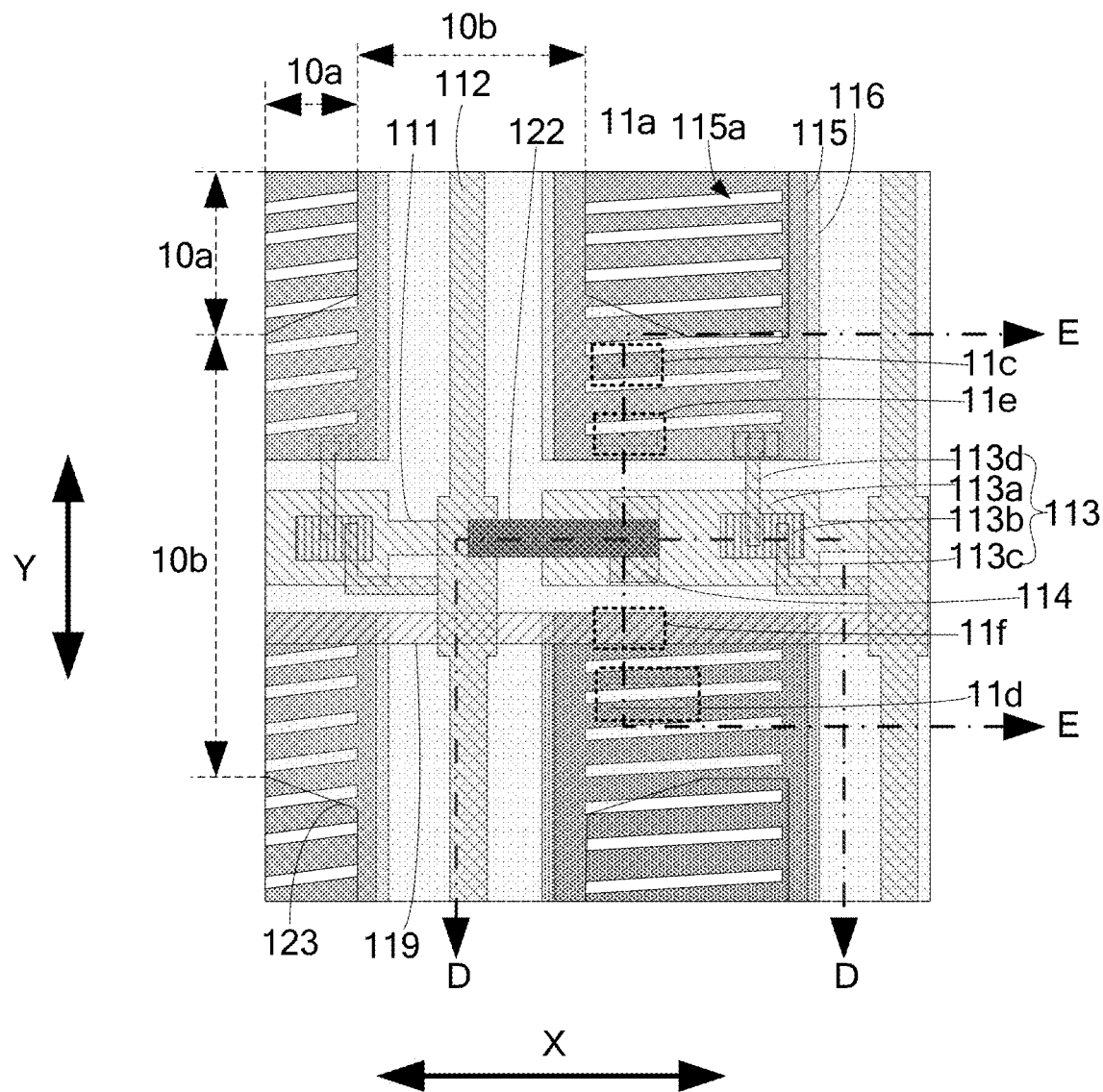
FIG. 7 shows a schematic position-relationship diagram of structures of respective layers in a second region of the display panel according to an embodiment of the present disclosure.

For example, as shown in FIGS. 4, 6, and 7, the orthographic projections of the raised portions 114 on the first substrate 110 may be strips, and the raised portions 114 extend in the second direction Y. That is to say, a length direction of the raised portions 114 is the second direction Y. Outer edges of the raised portions 114 in the second direction Y are located outside outer edges of the spacers 121 and 122 in the second direction Y. Such design may ensure that, when the spacers 121 and 122 move slightly in the second direction Y, it may still ensure that overlapping areas of the orthographic projections of the spacers 121 and 122 and the raised portions 114 on the first substrate 110 are consistent.

It should be noted that a thickness of the raised portion 114 may be the same as a thickness of the data line 112. That is to say, a surface of the raised portion 114 distal to the first substrate 110 may be flush with a surface of the data line 112 distal to the first substrate 110 flush, as shown in FIGS. 5 and. 8. In addition, the surface of the raised portion 114 distal to the first substrate 110 is slightly closer to the first substrate 110 than surfaces of the source electrode 113c and the drain electrode 113d distal to the first substrate 110, but the level difference is small, then, even if the spacers 121 and 122 move to the areas where the thin film transistors 113 are located after the display panel 10 is hit hard, it will not cause the display panel 10 to change compression amount too much, so as to release a situation that the display product is prone to mura phenomenon, and improve product reliability and product quality.

As shown in FIGS. 4, 6 and 7, the array substrate 11 may further include pixel electrodes 116, common electrodes 115 and common signal lines 119. The pixel electrodes 116 and the common electrodes 115 may be formed on the first substrate 110 and disposed opposite to each other in a thickness direction Z of the array substrate 11, and the thickness direction Z is orthogonal to the first direction X and the second direction Y. It should be noted that, most parts of the pixel electrodes 116 and the common electrodes 115 may be located in the open areas 10a, and small parts of the pixel electrodes 116 and the common electrodes 115 may be located in the non-open area 10b; wherein, the parts of the pixel electrodes 116 located in the non-open area 10b may be electrically connected to the drain electrodes 113d of the thin film transistors 113. The common signal lines 119 are formed on the first substrate 110 and located in the non-open area 10b. The common signal line 119 extends in the first direction X and is located on a side of the gate line 111. The common signal lines 119 may be electrically connected with the parts of the common electrodes 115 located in the non-open area 10b.

For example, the pixel electrodes 116 and the common electrodes 115 may be made of transparent materials such as ITO (indium tin oxide), indium zinc oxide (IZO), zinc oxide (ZnO), etc., so as to ensure light transmittance of the array substrate 11. The common signal lines 119 may include metal materials or alloy materials, such as metal single-layer or multi-layer structure formed of copper, molybdenum, aluminum, titanium, etc., to ensure good electrical conductivity thereof.

Figure 10:
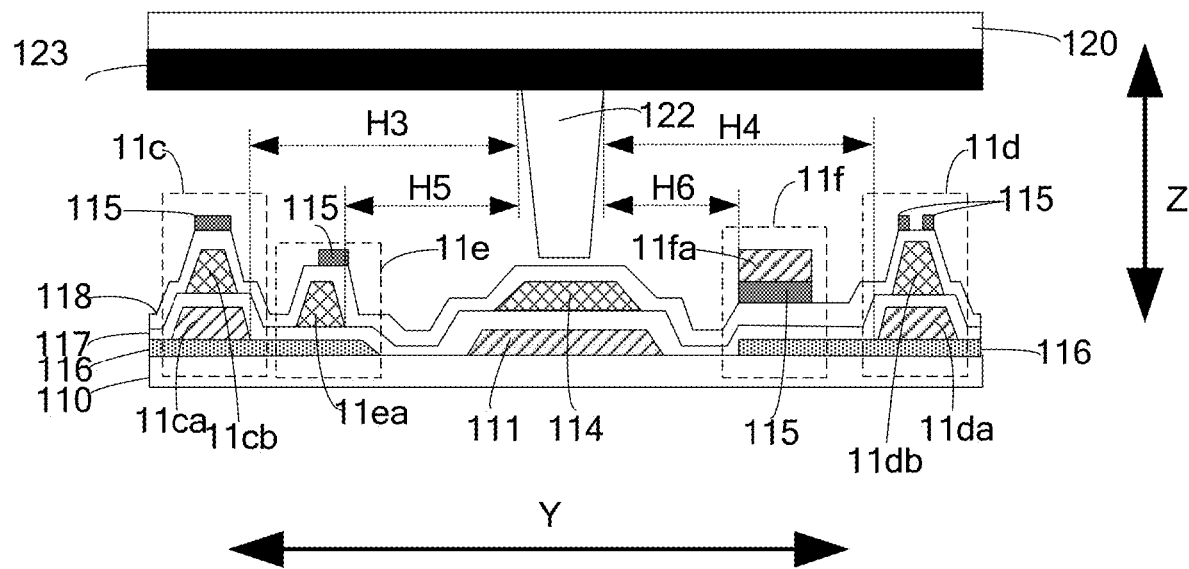
FIG. 10 shows a schematic cross-sectional view of the second region along a line E-E shown in FIG. 7.

In some embodiments, as shown in FIGS. 9 and 10, the pixel electrodes 116 may be located on the side of the data line 112 close to the first substrate 110, that is, the pixel electrodes 116 may be fabricated before fabricating the data lines 112. For example, the pixel electrodes 116 may be directly formed on the first substrate 110 and not in contact with the gate lines 111. It should be noted that the aforementioned first insulating layer 117 may cover the pixel electrode 116 as well. The drain electrodes 113d of the thin film transistors 113 and the data lines 112 may be disposed in the same layer, therefore, the drain electrodes 113d of the thin film transistors 113 may be electrically connected to the pixel electrodes 116 through via hole structures. The material of the pixel electrodes 116 may be different from that of the gate lines 111, therefore, the pixel electrodes 116 and the gate lines 111 may be fabricated by adopting different patterning processes. Specifically, the pixel electrodes 116 may be fabricated before the gate lines 111 are fabricated, or may be fabricated after the gate lines 111 have been fabricated, depending on the specific situation.

As shown in FIGS. 9 and 10, the common electrodes 115 may be located on the side of the data lines 112 distal to the first substrate 110, that is, the common electrodes 115 may be fabricated after the data lines 112 are fabricated. It should be noted that, after the data lines 112 have been fabricated, a second insulating layer 118 may be fabricated. The second insulating layer 118 is formed on the entire first substrate 110 and covers the data lines 112, as shown in FIG. 8. That is to say, the first insulating layer 117 and the second insulating layer 118 are provided between the common electrodes 115 and the pixel electrodes 116. For example, the second insulating layer 118 may be made of inorganic materials, for example, inorganic materials such as silicon oxide and silicon nitride.

The common signal lines 119 are located on the side of the data lines 112 distal to the first substrate 110, and lap the common electrodes 115; that is, after the common electrodes 115 have been fabricated, the common signal lines 119 may be fabricated. The common signal lines 119 directly lap the common electrodes 115, to realize electrical connection between the common signal lines 119 and the common electrodes 115.

It should be noted that relative positional relationships among the pixel electrode 116, the common electrode 115, the common signal line 119, the data line 112, and the gate line 111 are not limited to the forms described in the foregoing embodiments. The common electrodes 115 may be located on the side of the data lines 112 close to the first substrate 110, that is, the common electrodes 115 may be directly formed on the first substrate 110, and the common signal lines 119 may be arranged in the same layer as the gate line 111 and lap the common electrodes 115; the pixel electrodes 116 may be located on the side of the data line 112 distal to the first substrate 110; and it depends on the specific situation.

In some embodiments, one of the pixel electrode 116 and the common electrode 115 is a plate electrode, and another of the pixel electrode 116 and the common electrode 115 is a slit electrode. For example, as shown in FIGS. 4, 6 and 7, the common electrodes 115 may be slit electrodes, that is, slits 115a are opened on the electrodes, and the pixel electrodes 116 may be plate electrodes (that is, the electrodes are whole blocks and have no slits). An electric field generated by the common electrodes 115 in a same plane and electric fields generated between the pixel electrodes 116 form an multidimensional electric field, so that all the liquid crystal molecules 13 between the electrodes and directly above the electrodes are deflected, which may improve working efficiency of liquid crystal and increase light transmission efficiency, but not limited thereto. The common electrodes 115 may be the plate electrodes and the pixel electrodes 116 may be slit electrodes as well; or both the common electrodes 115 and the pixel electrodes 116 may be plate electrodes etc.; and it depends on the specific situation.

In addition, an alignment film (not shown in the figures) may be provided on the array substrate 11 as well, and the alignment film is adopted to align the liquid crystal molecules 13.

In some embodiments of the present disclosure, retaining walls may be provided on both sides of the auxiliary spacer 122 in the second direction Y to prevent the auxiliary spacer 122 from sliding to the open areas 10a when a product performs a drop test (Drop Test) or a push test (Push Test), so as to avoid display problems such as bright spots occurring on the product. The forces are different under different tests, therefore, in order to match different tests, different retaining wall designs may be performed around different auxiliary spacers 122, which may be divided into two designs. For example, the array substrate 11 may include first regions and second regions, and both the first regions and the second regions are located in the non-open area 10b.

As shown in FIG. 6, the first region may include the raised portion 114 corresponding to the auxiliary spacer 122, and a specific positional relationship of the raised portion 114 may be referred to the content described above, which will not be repeated here. The first region may further include a first retaining wall 11a and a second retaining wall 11b located on two sides of the raised portion 114 in the second direction Y. By arranging the first retaining wall 11a and the second retaining wall 11b, a sliding displacement of the auxiliary spacer 122 corresponding to the first region in the second direction Y may be limited, to prevent the auxiliary spacer 122 from sliding to the open areas 10a and scratching the alignment film of the open areas 10a, so as to avoid bright spots occurring on a display product. It should be noted that the first regions are mainly for the case where bright spots occur in the Push Test.

The first retaining wall 11a may be located on a side of the gate line 111 distal to the common signal line 119, that is, as shown in FIG. 6, the first retaining wall 11*a* may be located on a upper side of the gate line 111. As shown in FIG. 9, the first retaining wall 11*a* may include a first pad layer 11*aa* and a second pad layer 11*ab*; the first pad layer 11*aa* and the gate line 111 may be disposed in the same layer and disconnected from each other; the second pad layer 11*ab* may be in the same layer as the data line 112 and disconnected from the data line 112. Since the first pad layer 11*aa* and the gate line 111 are arranged in the same layer, and the second pad layer 11*ab* and the data line 112 are arranged in the same layer, mask cost may be reduced. It should be understood that the first pad layer 11*aa* and the second pad layer 11*ab* are not only limited to being arranged in the same layers as the gate line 111 and the data line 112, but also may be arranged on same layers with other layer structures, or formed separately, depending on the specific situation.

It should be noted that, an orthographic projection of the second pad layer 11*ab* on the first substrate 110 may be within an orthographic projection of the first pad layer 11*aa* on the first substrate 110. In addition, not only the first retaining wall 11*a* includes the first pad layer 11*aa* and the second pad layer 11*ab*, but also parts of the first insulating layer 117, the second insulating layer 118, the common electrode 115 and the pixel electrode 116, corresponding to the pad layer 11*ab* or the first pad layer 11*aa*, may belong to a part of the first retaining wall 11*a*. In other words, in the embodiments of the present disclosure, the first pad layer 11*aa* and the second pad layer 11*ab* are arranged to raise an area corresponding thereto in the array substrate 11 as a whole, to form the first retaining wall 11*a*, so as to better block the auxiliary spacer 122.

The second retaining wall 11*b* may be located on a side of the gate line 111 close to the common signal line 119, that is, as shown in FIG. 6, the second retaining wall 11*b* may be located on a lower side of the gate line 111. As shown in FIG. 9, the second retaining wall 11*b* may include a third pad layer 11*ba* and a fourth pad layer 11*bb*. The third pad layer 11*ba* may be disposed on a same layer as the common signal line 119. It should be noted that the third pad layer 11*ba* may be a part of structure of the common signal line 119. The fourth pad layer 11*bb* may be arranged in the same layer as the data line 112 and disconnected from the data line 112. Since the third pad layer 11*ba* may be arranged in the same layer as the common signal line 119, and the fourth pad layer 11*bb* and the data line 112 may be arranged in the same layer, the mask cost may be reduced. It should be understood that the third pad layer 11*ba* and the fourth pad layer 11*bb* are not only limited to being arranged in the same layers as the common signal line 119 and the data line 112, but also may be arranged on same layers with other layer structures, or formed separately, depending on the specific situation.

It should be noted that. not only the second retaining wall 11*b* includes the third pad layer 11*ba* and the fourth pad layer 11*bb*, but also the parts of the first insulating layer 117, the second insulating layer 118, the common electrode 115 and the pixel electrode 116 corresponding to the third pad layer 11*ba* or the fourth pad layer 11*bb*, may belong to a part of the second retaining wall 11*b*. In other words, in the embodiments of the present disclosure, the third pad layer 11*ba* and the fourth pad layer 11*bb* are arranged to raise an area corresponding thereto in the array substrate 11 as a whole, to form the second retaining wall 11*b*, so as to better block the auxiliary spacer 122.

As shown in FIG. 9, in the first region, a distance between an orthographic projection of the first retaining wall 11*a* on the first substrate 110 and an orthographic projection of the auxiliary spacer 122 on the first substrate 110 may be a first interval H1. For example, a ratio of the first interval H1 to the size of the data line 112 in the first direction X is 2 to 3. A distance between an orthographic projection of the second retaining wall 11*b* on the first substrate 110 and the orthographic projection of the auxiliary spacer 122 on the first substrate 110 may be a second interval H2. For example, a ratio of the second interval H2 to the size of the data line 112 in the first direction X is 2 to 3. When the size of the data line 112 in the first direction X is 5 μm to 7 μm, the first interval H1 and the second interval H2 may be 10 μm to 21 μm, such as 10 μm, 13 μm, 17 μm, 21 μm, etc., but not limited thereto, and the first interval H1 and the second interval H2 may be in other value ranges as well, depending on the specific situation.

Optionally, the distance between the orthographic projection of the first retaining wall 11*a* on the first substrate 110 and the orthographic projection of the auxiliary spacer 122 on the first substrate 110 and the distance between the orthographic projection of the second retaining wall 11*b* on the first substrate 110 and the orthographic projection of the auxiliary spacer 122 on the first substrate 110, may be equal, that is, the first interval H1 and the second interval H2 may be equal.

In some embodiments, a ratio of a size of the first retaining wall 11*a* in the first direction X to the size of the data line 112 in the first direction X is 0.8 to 1; and a ratio of a size of the second retaining wall 11*b* in the first direction X to the size of the data line 112 in the first direction X is 0.8 to 1. It should be noted that, the third pad layer 11*ba* in the second retaining wall 11*b* may belong to a part of the common signal line 119, therefore, the size of the second retaining wall 11*b* in the first direction X mentioned here may be understood as a size of the fourth pad layer 11*bb* in the first direction X.

When the size of the data line 112 in the first direction X is 5 μm to 7 μm, the size of the first retaining wall 11*a* in the first direction X and the size of the second retaining wall 11*b* in the first direction X may be 4 μm to 7 μm, for example: 4 μm, 5 μm, 6 μm, 7 μm, etc., but not limited thereto, and the size of the first retaining wall 11*a* in the first direction X and the size of the second retaining wall 11*b* in the first direction X may be in other value ranges as well, depending on the specific situation. It should be noted that the size of the first retaining wall 11*a* in the first direction X may be smaller than or equal to the size of the second retaining wall 11*b* in the first direction X, and may be larger than the size of the second retaining wall 11*b* in the first direction X size as well, depending on the specific situation.

As shown in FIG. 7, the second region includes the raised portion 114 corresponding to the auxiliary spacer 122, and the specific positional relationship of the raised portion 114 may be referred to the content described above, which will not be repeated here. The second region may further include a third retaining wall 11*c* and a fourth retaining wall 11*d* located on the two sides of the raised portion 114 in the second direction Y, a fifth retaining wall 11*e* located between the raised portion 114 and the third retaining wall 11*c*, and a sixth retaining wall 11*f* located between the raised portion 114 and the fourth retaining wall 11*d*. A thickness of the fifth retaining wall 11*e* is smaller than that of the third retaining wall 11*c*, and a thickness of the sixth retaining wall 11*f* is smaller than that of the fourth retaining wall 11*d*. In the embodiments of the present disclosure, by disposing two retaining walls with different thicknesses on the two sides of the raised portion 114 in the second region, a movement of the auxiliary spacer 122 toward the opening regions 10*a* may be further blocked. It should be noted that the second regions are mainly for the case where bright spots occur in the Drop Test.

As shown in FIG. 7, the third retaining wall 11c may be located on the side of the gate line 111 distal to the common signal line 119. That is, as shown in FIG. 7, the third retaining wall 11c may be located on the upper side of the gate line 111. As shown in FIG. 10, the third retaining wall 11c may include a fifth pad layer 11ca and a sixth pad layer 11cb; the fifth pad layer 11ca and the gate line 111 are arranged in the same layer and disconnected from each other; and the sixth pad layer 11cb and the data line 112 are disposed in the same layer and disconnected from each other. Since the fifth pad layer 11ca may be placed in the same layer as the gate line 111 and the sixth pad layer 11cb may be placed in the same layer as the data line 112, the mask cost may be reduced. It should be understood that the fifth pad layer 11ca and the sixth pad layer 11cb are not only limited to being arranged in the same layers as the gate line 111 and the data line 112, but also may be arranged in the same layers with other layer structures, or formed separately, depending on the specific situation.

It should be noted that an orthographic projection of the sixth pad layer 11cb on the first substrate 110 may be within an orthographic projection of the fifth pad layer 11ca on the first substrate 110. In addition, not only the third retaining wall 11c includes the fifth pad layer 11ca and the sixth pad layer 11cb, but also the parts of the first insulating layer 117, the second insulating layer 118, the common electrode 115 and the pixel electrode 116 corresponding to the fifth pad layer 11ca or the sixth pad layer 11cb, may belong to a part of the third retaining wall 11c. In other words, in the embodiments of the present disclosure, the fifth pad layer 11ca and the sixth pad layer 11cb are arranged to raise an area corresponding thereto in the array substrate 11 as a whole, to form the third retaining wall 11c, so as to better block the auxiliary spacer 122.

The fourth retaining wall 11d may be located on a side of the common signal line 119 distal to the gate line 111, that is, as shown in FIG. 7, the fourth retaining wall 11d may be located on the lower side of the common signal line 119. As shown FIG. 10, the fourth retaining wall 11d may include a seventh pad layer 11da and an eighth pad layer 11db; the seventh pad layer 11da and the gate line 111 may be arranged in the same layer and disconnected from each other; and the eighth pad layer 11db and the data line 112 may be arranged in the same layer and disconnected from each other. Since the seventh pad layer 11da may be arranged in the same layer as the gate line 111 and the eighth pad layer 11db may be arranged in the same layer as the data line 112, the mask cost may be reduced. It should be understood that the seventh pad layer 11da and the eighth pad layer 11db are not only limited to being arranged in the same layers as the gate lines 111 or the data lines 112, but also may be arranged in the same layers with other layer structures, or formed separately, depending on the specific situation.

It should be noted that an orthographic projection of the eighth pad layer 11db on the first substrate 110 may be within an orthographic projection of the seventh pad layer 11da on the first substrate 110. In addition, not only the fourth retaining wall 11d includes the seventh pad layer 11da and the eighth pad layer 11db, but also the parts of the first insulating layer 117, the second insulating layer 118, the common electrode 115 and the pixel electrode 116 corresponding to the seventh pad layer 11da or the eighth pad layer 11db, may belong to a part of the fourth retaining wall 11d. In other words, in the embodiments of the present disclosure, the seventh pad layer 11da and the eighth pad layer 11db are arranged to raise an area corresponding thereto in the array substrate 11 as a whole, to form the fourth retaining wall 11d, so as to better block the auxiliary spacer 122.

As shown in FIG. 7, the fifth retaining wall 11e may be located on the side of the gate line 111 distal to the common signal line 119. That is, as shown in FIG. 7, the fifth retaining wall 11e may be located on the upper side of the gate line 111. In addition, it should be understood that the fifth retaining wall 11e is located on a side of the third retaining wall 11c close to the gate line 111, that is, as shown in FIG. 7, the fifth retaining wall 11e may be located on a lower side of the third retaining wall 11c. As shown in FIG. 10, the fifth retaining wall 11e may include a ninth pad layer 11ea arranged in the same layer as the data line 112 and disconnected from the data line 112. Since the ninth pad layer 11ca may be arranged in the same layer as the data line 112, the mask cost may be reduced. It should be understood that the ninth pad layer 11ea is not only limited to being disposed in the same layer as the data line 112, but also may be arranged in the same layers with other layer structures, or formed separately, depending on the specific situation.

It should be noted that, not only the fifth retaining wall 11e includes the ninth pad layer 11ca, but also the parts of the first insulating layer 117, the second insulating layer 118, the common electrode 115 and the pixel electrode 116 corresponding to the ninth pad layer 11ca, may belong to a part of the fifth retaining wall 11e. In other words, in the embodiments of the present disclosure, the ninth pad layer 11ea is arranged to raise an area corresponding thereto in the array substrate 11 as a whole, to form the fifth retaining wall 11e, so as to better block the auxiliary spacer 122.

As shown in FIG. 7, the sixth retaining wall 11f may be located on the side of the gate line 111 close to the common signal line 119. That is, as shown in FIG. 7, the sixth retaining wall 11f may be located on the lower side of the gate line 111, and the sixth retaining wall 11f may be located on an upper side of the fourth retaining wall 11d. The sixth retaining wall 11f may include a tenth pad layer 11fa arranged in the same layer as the common signal line 119. It should be noted that, as shown in FIGS. 7 and 10, the tenth pad layer 11fa may be a part of structure of the common signal line 119. By adopting the part of structure of the common signal line 119 as a part of the sixth retaining wall 11f, the blocking of the auxiliary spacer 122 may be realized, and at the same time, cost may be reduced and structures in the array substrate 11 may be reasonably utilized. It should be understood that the tenth pad layer 11fa is not only limited to being disposed in the same layer as the common signal line 119, but also may be arranged in the same layers with other layer structures, or formed separately, depending on the specific situation.

It should be noted that not only the sixth retaining wall 11f includes the tenth pad layer 11fa, but also the parts of the first insulating layer 117, the second insulating layer 118, the common electrode 115 and the pixel electrode 116 corresponding to the tenth pad layer 11fa, may belong to a part of the sixth retaining wall 11f.

As shown in FIG. 10, in the second region, a distance between an orthographic projection of the third retaining wall 11c on the first substrate 110 and the orthographic projection of the auxiliary spacer 122 on the first substrate 110 may be a third interval H3; a distance between an orthographic projection of the fourth retaining wall 11d on the first substrate 110 and the orthographic projection of the auxiliary spacer 122 on the first substrate 110 may be a fourth interval H4; a distance between an orthographic projection of the fifth retaining wall 11e on the first substrate 110 and the orthographic projection of the auxiliary spacer 122 on the first substrate 110 may be a fifth interval H5; and a distance between an orthographic projection of the sixth retaining wall 11f on the first substrate 110 and the orthographic projection of the auxiliary spacer 122 on the first substrate 110 may be a sixth interval H6; wherein the third interval H3 may be equal to the fourth interval H4, and the fifth interval H5 may be larger than the sixth interval H6.

Optionally, ratios of the third interval H3 and the fourth interval H4 to the size of the data line 112 in the first direction X may be 5 to 6. When the size of the data line 112 in the first direction X is 5 μm to 7 μm, the third interval H3 and the fourth interval H4 may be 25 μm to 42 μm, for example, 25 μm, 32 μm, 37 μm, 42 μm, etc., but not limited thereto, and the third interval H3 and the fourth interval H4 may be in other value ranges as well, depending on the specific situation. A ratio of the fifth interval H5 to the size of the data line 112 in the first direction X may be 2 to 3. Wherein, when the size of the data line 112 in the first direction X is 5 μm to 7 μm, the fifth interval H5 may be 10 μm to 21 μm, for example, 10 μm, 13 μm, 17 μm, 21 μm, etc., but not limited thereto, and the fifth interval H5 may be in other value ranges as well, depending on the specific situation. A ratio of the sixth interval H6 to the size of the data line 112 in the first direction X may be 2 to 3. When the size of the data line 112 in the first direction X is 5 μm to 7 μm, the sixth interval H6 may be 10 μm to 21 μm, for example, 10 μm, 15 μm, 21 μm, etc., but not limited thereto, and the sixth interval H6 may be in other value ranges as well, depending on the specific situation.

In addition, a ratio of a distance between the third retaining wall 11c and the fifth retaining wall 11e to the size of the data line 112 in the first direction X may be 1 to 2. When the size of the data line 112 in the first direction X is 5 μm to 7 μm, the distance between the third retaining wall 11c and the fifth retaining wall 11e may be 5 μm to 14 μm, for example, 5 μm, 10 μm, 14 μm, etc., but not limited thereto, and the distance between the third retaining wall 11c and the fifth retaining wall 11e may be in other value ranges as well, depending on the specific situation.

In some embodiments of the present disclosure, a size of the fourth retaining wall 11d in the first direction X may be larger than a size of the third retaining wall 11c in the first direction X, and larger than a size of the fifth retaining wall 11e in the first direction X. For example, ratios of the sizes of the third retaining wall 11c and the fifth retaining wall 11e in the first direction X to the size of the data line 112 in the first direction X is 0.8 to 1; and a ratio of the size of the fourth retaining wall 11d in the first direction X to the size of the data line 112 in the first direction X is 1.4 to 2.

When the size of the data line 112 in the first direction X is 5 μm to 7 μm, the sizes of the third retaining wall 11c and the fifth retaining wall 11e in the first direction X may be 4 μm to 7 μm, for example, 4 μm, 5 μm 6 μm, 7 μm, etc.; and the size of the fourth retaining wall 11d in the first direction X may be 7 μm to 14 μm, for example, 7 μm, 11 μm, 14 μm, etc.; but not limited thereto, the size of the third retaining wall 11c in the first direction X, the size of the fourth retaining wall 11d in the first direction X, and the size of the fifth retaining wall 11e in the first direction X may be in other value ranges as well, depending on the specific situation.

It should be noted that the size of the third retaining wall 11c in the first direction X may be smaller than or equal to the size of the fifth retaining wall 11e in the first direction X, and may be larger than the size of the fifth retaining wall 11e in the first direction X size as well, depending on the specific situation.

The aforementioned design of the second region is mainly optimized for the Drop Test. When the whole machine is dropped, that is, when the PCB (Printed Circuit Board) is dropped, facing up or facing down, the display panel 10 will bend after being stressed, then the color filter substrate 12 moves to a middle area of the display panel 10, and a risk of scratching a side of the common signal line 119 by the auxiliary spacer 122 is relatively high. Therefore, in the embodiments of the present disclosure, by making the size of the fourth retaining wall 11d in the first direction X larger than the size of the third retaining wall 11c in the first direction X, the alignment film in the open area 10a on a side close to the common signal line 119 is prevented from being scratched to generate bright spots, which improves product reliability and product quality.

It should be noted that the portion of the array substrate 11 located in the non-open area 10b not only includes the aforementioned first and second regions corresponding to the auxiliary spacers 122, but also includes main regions corresponding to the main spacers 121. As shown in FIG. 4, the main regions includes the raised portions 114 corresponding to the main spacers 121, the specific positional relationships of the raised portions 114 may refer to the content described above, and will not be repeated here. No retaining wall needs to be provided on both sides of the raised portions 114 in the second direction Y in the main regions. That is to say, no pad layer needs to be provided on both sides of the raised portions 114 in the second direction Y in the main regions. Such design may mainly release a situation of DNU (Dark Not Uniformly, uneven dark state) during touch.

The main regions, the first regions and the second regions are provided in multiples, and a plurality of the main regions, the first regions and the second regions may be evenly distributed in the non-open area 10b, so that the display panel 10 has good reliability under different tests.

In some embodiments, as shown in FIGS. 5, 8 to 10, the color filter substrate 12 may not only include the aforementioned second substrate 120, the main spacers 121, and the auxiliary spacers 122, but also include a black matrix 123 and filter layers (not shown in the figures). The filter layers are located in the open areas 10a, and the black matrix 123 is located in the non-open area 10b. The main spacers 121 and the auxiliary spacers 122 are located on a side of the black matrix 123 distal to the second substrate 120. In addition, the color filter substrate 12 may be provided with the alignment film (not shown in the figures) for aligning the liquid crystal molecules 13 as well.

The second substrate 120 may be located in the open areas 10a and the non-open area 10b; and the second substrate 120 may be a single-layer structure or a multi-layer structure. For example, the second substrate 120 may be a single-layer structure, and material of the second substrate 120 may be glass, that is, the second substrate 120 may be a glass substrate; but not limited thereto, other materials may be applicable as well, depending on the specific situation.

It should be noted that both the orthographic projections of the main spacers 121 and the auxiliary spacers 122 on the first substrate 110 are strips. A length direction of the main spacers 121 and the auxiliary spacers 122 may be the first direction X, and a width direction of the main spacers 121 and the auxiliary spacers 122 may be the second direction Y; wherein, a size of the main spacers 121 in the first direction X is equal to a size of the auxiliary spacers 122 in the first direction X, and a size of the main spacers 121 in the second direction Y is larger than a size of the auxiliary spacers 122 in the second direction Y, but not limited thereto.

In the embodiments of the present disclosure, a part of the orthographic projections of the main spacer 121 and the auxiliary spacer 122 on the first substrate 110 overlap with the orthographic projection of the raised portion 114 on the first substrate 110, and another part of the orthographic projections of the main spacer 121 and the auxiliary spacer 122 on the first substrate 110 overlap with the overlapping part of the data line 112 and the gate line 111 on the first substrate 110. Under a condition that areas of the main spacer 121 and the auxiliary spacer 122 remain unchanged, at this time, thicknesses of areas of the array substrate 11 corresponding to the main spacer 121 and the auxiliary spacer 122, and thicknesses of areas of the array substrate 11 on both sides thereof in the first direction X, are approximately the same, or the same. In this way, when the main spacer 121 and the auxiliary spacer 122 slide in the first direction X, basically, it will not cause change of compression amount and thickness change of the display panel 10, and resistances applied on the main spacer 121 and the auxiliary spacer 122 are almost very small, which is convenient for quick restoring, so as to solve a situation that Mura is prone to occur.

Ratios of the sizes of the main spacer 121 and the auxiliary spacer 122 in the first direction X to the size of the data line 112 in the first direction X is 2 to 3. For example, when the size of the data line 112 in the first direction X is 5 µm to 7 µm, the sizes of the main spacer 121 and the auxiliary spacer 122 in the first direction X may be 10 µm to 21 µm, for example, 10 µm, 14 µm, 18 µm, 21 µm, etc., but not limited thereto, and the sizes of the main spacer 121 and the auxiliary spacer 122 in the first direction X may be in other value ranges as well, depending on the specific situation. A ratio of the size of the main spacer 121 in the second direction Y to the size of the data line 112 in the first direction X may be 1.4 to 2. For example, when the size of the data line 112 in the first direction X is 5 µm to 7 µm, the size of the main spacer 121 in the second direction Y may be 7 µm to 14 µm, for example, 7 µm, 10 µm, 12 µm, 14 µm, etc., but not limited thereto, and the size of the main spacer 121 in the second direction Y may be in other value ranges as well, depending on the specific situation. A ratio of the size of the auxiliary spacer 122 in the second direction Y to the size of the data line 112 in the first direction X is 1 to 1.5. For example, when the size of the data line 112 in the first direction X is 5 µm to 7 µm, the size of the auxiliary spacer 122 in the second direction Y may be 5 µm to 10 µm, for example, 5 µm, 7 µm, 10 µm, etc., but not limited thereto, and the size of the auxiliary spacer 122 in the second direction Y may be in other value ranges as well, depending on the specific situation.

In some embodiments, a ratio of a distance between an edge of the main spacer 121 and an edge of the black matrix 123 in the second direction Y to the size of the data line 112 in the first direction X may be 6 to 7; and a ratio of a distance between an edge of the auxiliary spacer 122 and the edge of the black matrix 123 in the second direction Y to the size of the data line 112 in the first direction X may be 6 to 7.

For example, when the size of the data line 112 in the first direction X is 5 µm to 7 µm, the distance between the edge of the main spacer 121 and an edge of the black matrix 123 in the second direction Y, and the distance between the edge of the auxiliary spacer 122 and the edge of the black matrix 123 in the second direction Y, may be 30 µm to 49 µm, such as 30 µm, 40 µm, 49 µm, etc., but not limited thereto, and the distance between the edge of the main spacer 121 and an edge of the black matrix 123 in the second direction Y, and the distance between the edge of the auxiliary spacer 122 and the edge of the black matrix 123 in the second direction Y, may be in other value ranges as well, depending on the specific situation.

In addition, a ratio of a distance between an edge of the fourth retaining wall 11$d$ and the edge of the black matrix 123 in the second direction Y to the size of the data line 112 in the first direction X is 1 to 2. For example, when the size of the data line 112 in the first direction X is 5 µm to 7 µm, the distance between the edge of the fourth retaining wall 11$d$ and the edge of the black matrix 123 in the second direction Y may be 5 µm to 14 µm, such as 5 µm, 8 µm, 11 µm, 14 µm, etc., but not limited thereto, and the distance between the edge of the fourth retaining wall 11$d$ and the edge of the black matrix 123 in the second direction Y, may be in other value ranges as well, depending on the specific situation.

The embodiments of the present disclosure further provide a display device including the display panel 10 described in any of the above embodiments. The display device may be a liquid crystal display device.

According to the embodiments of the present disclosure, specific types of the display device is not particularly limited, and any type of display device commonly used in the art may be adopted, such as liquid crystal displays, mobile devices such as mobile phones and notebook computers, and wearable devices such as watches and wristbands, etc. Those skilled in the art may make corresponding selections according to specific uses of the display devices, which will not be repeated here.

It should be noted that, in addition to the display panel 10, the display device further includes other necessary assemblies and components. Taking a liquid crystal display as an example, it may further include a backlight module, a housing, a main circuit board, a power cord, and so on. Those skilled in the art may make corresponding supplements according to specific usage requirements of the display device, which will not be repeated here.

Other embodiments of the present disclosure will readily occur to those skilled in the art upon consideration of the specification and practice of the invention disclosed herein. This disclosure is intended to cover any variations, uses, or adaptations of this disclosure that follow the general principles of this disclosure and include common general knowledge or techniques in the technical field not disclosed by this disclosure. The specification and examples are to be regarded as exemplary only, and the true scope and spirit of the disclosure are indicated by the appended claims.

What is claimed is:

1. A display panel, comprising open areas and a non-open area surrounding the open areas, wherein the display panel comprises:
an array substrate comprising a first substrate and gate lines, data lines, thin film transistors and raised portions located in the non-open area and formed on the first substrate; wherein the gate lines and the data lines are insulated from each other, the gate lines extend in a first direction, and the data lines extend in a second direction; orthographic projections of the data lines on the first substrate have overlaps with orthographic projections of the gate lines on the first substrate; orthographic projections of the raised portions on the first substrate are located within the orthographic projections of the gate lines on the first substrate, and have no overlap with the orthographic projections of the data lines and orthographic projections of the thin film transistors on the first substrate; and a color filter substrate comprising a second substrate and spacers located on a side of the second substrate facing the array substrate; wherein orthographic projections of the spacers on the first substrate have overlaps with the orthographic projections of the raised portions on the first substrate, and have overlaps with overlapping areas of the data lines and the gate lines on the first substrate;

wherein the spacers are provided in multiples; a plurality of the spacers comprise auxiliary spacers, and gaps are provided between the auxiliary spacers and the array substrate; wherein the array substrate comprises:

first regions located in the non-open area; wherein the first regions comprise the raised portions corresponding to the auxiliary spacers, and first retaining walls and second retaining walls correspondingly located on two sides of the respective raised portions in the second direction; and second regions located in the non-open area; wherein the second regions comprise the raised portions corresponding to the auxiliary spacers, third retaining walls and fourth retaining walls correspondingly located on two sides of the respective raised portions in the second direction, fifth retaining walls correspondingly located between the respective raised portions and the third retaining walls, and sixth retaining walls correspondingly located between the respective raised portions and the fourth retaining walls.

2. The display panel according to claim 1, wherein the raised portions are disposed in a same layer as the data lines, and are insulated from the data lines, the gate lines, and the thin film transistors.

3. The display panel according to claim 2, wherein the orthographic projections of the raised portions on the first substrate are strips, and the raised portions extend in the second direction; and outer edges of the raised portions in the second direction are located outside outer edges of the spacers in the second direction.

4. The display panel according to claim 1, wherein,
the array substrate further comprises common signal lines located in the non-open area, and the common signal lines extend in the first direction and each located on a side of the corresponding gate lines;
each of the first retaining walls is located on a side of the corresponding gate line distal to the common signal line, and the first retaining wall comprises a first pad layer and a second pad layer; the first pad layer is arranged on a same layer as the gate line; and the second pad layer is arranged on a same layer as the data line; and
each of the second retaining walls is located on a side of the corresponding gate line close to the common signal line, and the second retaining wall comprises a third pad layer and a fourth pad layer; the third pad layer is arranged on a same layer as the common signal line; and the fourth pad layer is arranged on a same layer as the data line.

5. The display panel according to claim 4, wherein in the first region,
a distance between an orthographic projection of the first retaining wall on the first substrate and an orthographic projection of the auxiliary spacer on the first substrate is a first interval; and a ratio of the first interval to a size of the data line in the first direction is 2 to 3; and a distance between an orthographic projection of the second retaining wall on the first substrate and the orthographic projection of the auxiliary spacer on the first substrate is a second interval; and a ratio of the second interval to the size of the data line in the first direction is 2 to 3.

6. The display panel according to claim 5, wherein the first interval is equal to the second interval.

7. The display panel according to claim 4, wherein,
a ratio of a size of the first retaining wall in the first direction to a size of the data line in the first direction is 0.8 to 1; and
a ratio of a size of the second retaining wall in the first direction to the size of the data line in the first direction is 0.8 to 1.

8. The display panel according to claim 4, wherein,
each of the third retaining wall is located on the side of the corresponding gate line distal to the common signal line, and the third retaining wall comprises a fifth pad layer and a sixth pad layer; the fifth pad layer is arranged on the same layer as the gate line; and the sixth pad layer is arranged on the same layer as the data line;
each of the fourth retaining wall is located on a side of the corresponding common signal line distal to the gate line, and the fourth retaining wall comprises a seventh pad layer and an eighth pad layer; the seventh pad layer is arranged on the same layer as the gate line; and the eighth pad layer is arranged on the same layer as the data line;
each of the fifth retaining wall is located on the side of the corresponding gate line distal to the common signal line, and the fifth retaining wall comprises a ninth pad layer disposed in the same layer as the data line; and
each of the sixth retaining wall is located on the side of the corresponding gate line close to the common signal line, and the sixth retaining wall comprises a tenth pad layer disposed in the same layer as the common signal line.

9. The display panel according to claim 8, wherein in the second region,
a distance between an orthographic projection of the third retaining wall on the first substrate and an orthographic projection of the auxiliary spacer on the first substrate is a third interval;
a distance between an orthographic projection of the fourth retaining wall on the first substrate and the orthographic projection of the auxiliary spacer on the first substrate is a fourth interval;
a distance between an orthographic projection of the fifth retaining wall on the first substrate and the orthographic projection of the auxiliary spacer on the first substrate is a fifth interval; and
a distance between an orthographic projection of the sixth retaining wall on the first substrate and the orthographic projection of the auxiliary spacer on the first substrate is a sixth interval;
wherein the third interval is equal to the fourth interval; and the fifth interval is larger than the sixth interval.

10. The display panel according to claim 9, wherein,
ratios of the third interval and the fourth interval to a size of the data line in the first direction is 5 to 6;
ratios of the fifth interval and the sixth interval to the size of the data line in the first direction is 2 to 3; and
a ratio of a distance between the third retaining wall and the fifth retaining wall to the size of the data line in the first direction is 1 to 2.

11. The display panel according to claim 8, wherein,
a size of the fourth retaining wall in the first direction is larger than a size of the third retaining wall in the first direction, and is larger than a size of the fifth retaining wall in the first direction.

12. The display panel according to claim 11, wherein,
ratios of the sizes of the third retaining wall and the fifth retaining wall in the first direction to a size of the data line in the first direction is 0.8 to 1; and
a ratio of the size of the fourth retaining wall in the first direction to the size of the data line in the first direction is 1.4 to 2.

13. The display panel according to claim 4, wherein,
the thin film transistors comprise source electrodes and drain electrodes, the source electrodes and the drain electrodes are arranged in the same layer as the data lines, and the source electrodes are electrically connected to the data lines; and
the array substrate further comprises pixel electrodes and common electrodes disposed opposite to each other in a thickness direction of the array substrate, and the pixel electrodes and the common electrodes are formed on the first substrate and located in the open areas and the non-open area;
wherein parts of the pixel electrodes located in the non-open area are electrically connected to the drain electrodes; the common signal lines are electrically connected to parts of the common electrodes located in the non-open area; and the thickness direction is orthogonal to the first direction and the second direction.

14. The display panel according to claim 13, wherein,
the gate lines are located on a side of the data lines close to the first substrate;
the pixel electrodes are located on the side of the data line close to the first substrate;
the common electrodes are located on a side of the data lines distal to the first substrate; and
the common signal lines are located on the side of the data line distal to the first substrate, and respectively lap the corresponding common electrodes.

15. The display panel according to claim 14, wherein,
one of the pixel electrode and the common electrode is a plate electrode, and another one of the pixel electrode and the common electrode is a slit electrode.

16. The display panel according to claim 1, wherein,
the spacers further comprise main spacers, and the main spacers are in contact with the array substrate; and
orthographic projections of both the main spacers and the auxiliary spacers on the first substrate are strips, and a length direction of the main spacers and the auxiliary spacers is the first direction, and a width direction of the main spacers and the auxiliary spacers is the second direction;
wherein a size of the main spacers in the first direction is equal to a size of the auxiliary spacers in the first direction; and a size of the main spacers in the second direction is larger than a size of the auxiliary spacers in the second direction.

17. The display panel according to claim 16, wherein,
ratios of the sizes of the main spacers and the auxiliary spacers in the first direction to a size of the data line in the first direction is 2 to 3;
a ratio of the size of the main spacers in the second direction to the size of the data line in the first direction is 1.4 to 2; and
a ratio of the size of the auxiliary spacers in the second direction to the size of the data line in the first direction is 1 to 1.5.

18. The display panel according to claim 16, wherein,
the color filter substrate further comprises a black matrix corresponding to the non-open area;
a ratio of a distance between an edge of the main spacer and an edge of the black matrix in the second direction to the size of the data line in the first direction is 6 to 7;
a ratio of a distance between an edge of the auxiliary spacer and the edge of the black matrix in the second direction to the size of the data line in the first direction is 6 to 7; and
a ratio of a distance between an edge of the fourth retaining wall and the edge of the black matrix in the second direction to the size of the data line in the first direction is 1 to 2.

19. A display device, comprising the display panel according to claim 1.

* * * * *